(12) United States Patent
Takagi et al.

(10) Patent No.: US 10,403,677 B2
(45) Date of Patent: Sep. 3, 2019

(54) LINEAR IMAGE SENSOR

(71) Applicant: HAMAMATSU PHOTONICS K.K., Hamamatsu-shi, Shizuoka (JP)

(72) Inventors: Shin-ichiro Takagi, Hamamatsu (JP); Yasuhito Yoneta, Hamamatsu (JP); Hisanori Suzuki, Hamamatsu (JP); Masaharu Muramatsu, Hamamatsu (JP)

(73) Assignee: HAMAMATSU PHOTONICS K.K., Hamamatsu-shi, Shizuoka (JP)

(*) Notice: Subject to any disclaimer, the term of this patent is extended or adjusted under 35 U.S.C. 154(b) by 0 days.

(21) Appl. No.: 15/032,130

(22) PCT Filed: Oct. 31, 2014

(86) PCT No.: PCT/JP2014/079140
§ 371 (c)(1),
(2) Date: Apr. 26, 2016

(87) PCT Pub. No.: WO2015/068667
PCT Pub. Date: May 14, 2015

(65) Prior Publication Data
US 2016/0268334 A1 Sep. 15, 2016

(30) Foreign Application Priority Data
Nov. 5, 2013 (JP) .................... 2013-229745

(51) Int. Cl.
H04N 5/369 (2011.01)
H04N 5/372 (2011.01)
H01L 27/148 (2006.01)

(52) U.S. Cl.
CPC .. *H01L 27/14825* (2013.01); *H01L 27/14812* (2013.01); *H01L 27/14843* (2013.01); *H04N 5/3692* (2013.01); *H04N 5/37213* (2013.01)

(58) Field of Classification Search
CPC ......... H01L 27/14812; H01L 27/14825; H01L 27/14843; H01L 27/14685;
(Continued)

(56) References Cited
U.S. PATENT DOCUMENTS 6,465,820 B1 10/2002 Fox
2002/0097331 A1 7/2002 Yamada et al.
(Continued)

FOREIGN PATENT DOCUMENTS

EP 2 273 551 1/2011
JP S61-49472 A 3/1986
(Continued)

OTHER PUBLICATIONS

International Preliminary Report on Patentability dated May 19, 2016 for PCT/JP2014/079140.
(Continued)

*Primary Examiner* — Mark W Tornow
*Assistant Examiner* — Priya M Rampersaud
(74) *Attorney, Agent, or Firm* — Drinker Biddle & Reath LLP

(57) ABSTRACT

An optical detection unit AR is divided so as to have a plurality of pixel regions PX aligned in a column direction. Signals from the plurality of pixel regions PX are integrated for each optical detection unit AR, and output the signal as an electrical signal corresponding to a one-dimensional optical image in time series. Each of the pixel regions PX includes a resistive gate electrode R which promotes transfer of charges in the photoelectric conversion region and a charge accumulation region S2. A drain region ARD is adjacent to the charge accumulation region S2 through a channel region.

4 Claims, 19 Drawing Sheets

(58) Field of Classification Search
CPC ......... H01L 27/14837; H01L 27/14612; H01L 27/14806; H04N 5/3692; H04N 5/37213; H04N 5/2253; H04N 5/378; H04N 5/355; H04N 5/3725

See application file for complete search history.

(56) References Cited

U.S. PATENT DOCUMENTS

| | | | |
|---|---|---|---|
| 2010/0045841 A1* | 2/2010 | Otsuka | H01L 27/14601 348/314 |
| 2011/0024607 A1* | 2/2011 | Suzuki | H04N 5/3535 250/208.1 |
| 2011/0075005 A1* | 3/2011 | Suzuki | H04N 5/37213 348/311 |
| 2013/0270609 A1 | 10/2013 | Takagi et al. | |
| 2013/0285188 A1 | 10/2013 | Ikeya et al. | |

FOREIGN PATENT DOCUMENTS

| | | |
|---|---|---|
| JP | 06283704 A | 10/1994 |
| JP | H08-149379 A | 6/1996 |
| JP | H11-32166 A | 2/1999 |
| JP | 2003-332557 A | 11/2003 |
| JP | 2004-303982 A | 10/2004 |
| JP | 2004-328253 | 11/2004 |
| JP | 2009-302348 A | 12/2009 |
| JP | 2012-146917 | 8/2012 |
| JP | 2012-151364 A | 8/2012 |
| TW | 201230317 | 7/2012 |
| WO | WO-2008/066067 A1 | 6/2008 |
| WO | WO 2012/096052 | 7/2012 |

OTHER PUBLICATIONS

International Preliminary Report on Patentability dated May 10, 2016 for PCT/JP2014/079140.

* cited by examiner

*Fig.5*

|  | RGL | RGH(>RGL) | PV |
|---|---|---|---|
| t1 | Constant | Constant | High: (Charge is accumulated) |
| t2 | Constant | Constant | Low: (Charge is transferred) |

Fig.6
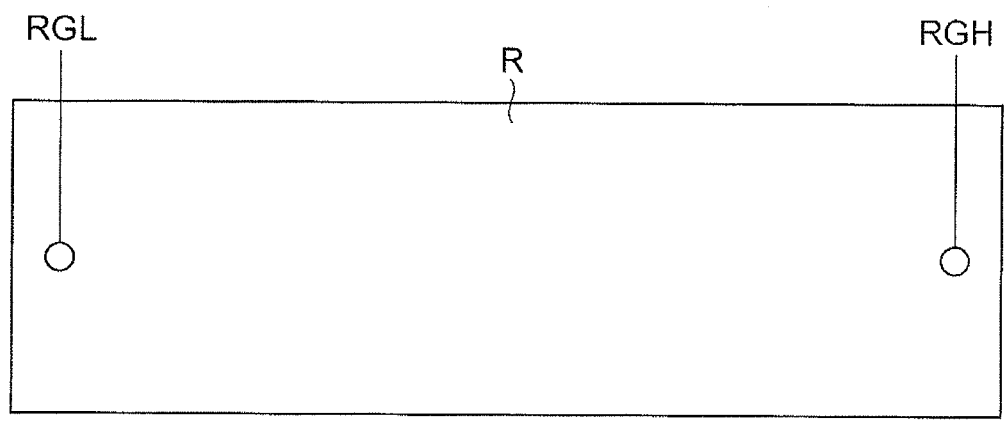
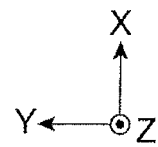

*Fig.7*
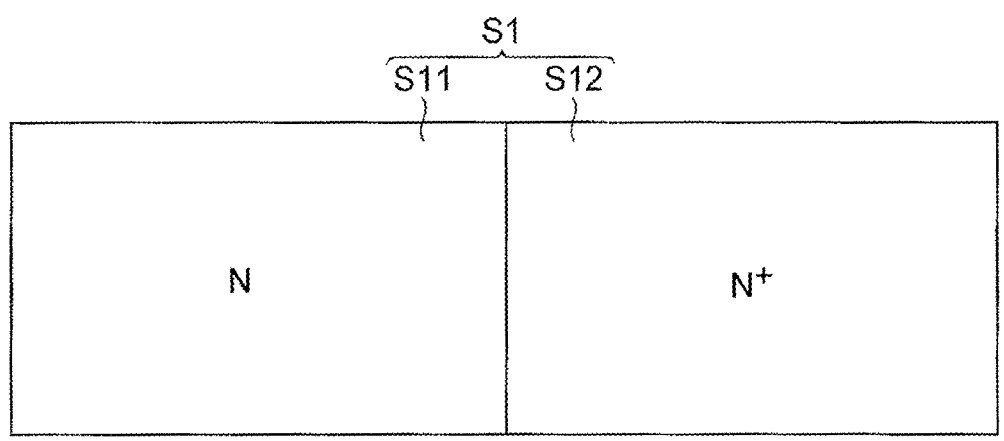
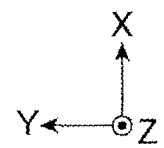

*Fig.11*
(A)
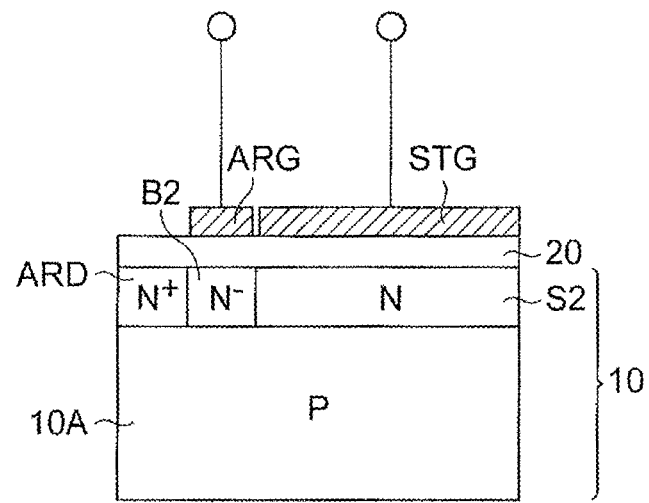
(B) ARG OFF
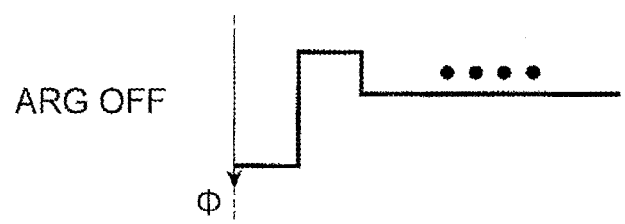
(C) ARG ON
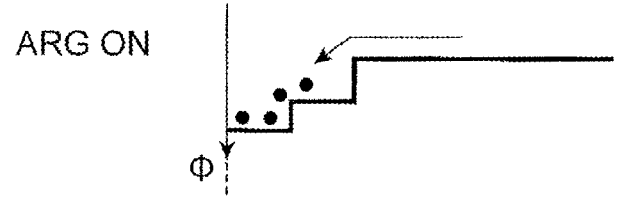

LINEAR IMAGE SENSOR

TECHNICAL FIELD

The present invention relates to a linear image sensor which converts an incident energy beam (light/X-rays) into a charge (electrons), and transfers a converted charge by changing a potential in a semiconductor.

BACKGROUND ART

A linear image sensor such as a charge-coupled device (CCD) is a solid-state imaging device which performs a photoelectric conversion on a one-dimensional optical image incident thereon and outputs an electrical signal generated by the photoelectric conversion in time series. An image sensor of the related art is described in, for example, Patent Literatures 1 to 3. Among such image sensors, a linear image sensor (one-dimensional CCD) is used for a different purpose from a two-dimensional image sensor, and different characteristics are required.

FIG. 18 shows a linear image sensor of the related art. A plurality of pixels are aligned in a row direction and there is only one pixel in a column direction in a light-sensitive region. Charges generated in each pixel are transferred to a horizontal register through a region directly beneath a transfer gate electrode according to incidence of an energy beam. The charges input to the horizontal register are transferred in a horizontal direction, and are output to the outside through an amplifier.

Such a linear image sensor is used in a spectroscopic analysis to detect weak light. In order to realize a high S/N ratio, it is preferable to increase a light-receiving unit area of one pixel to increase the number of signal photons incident on the one pixel. In this case, a size of a photoelectric conversion region of one pixel in a length direction (charge transfer direction) is increased.

In a CCD, generated charges are transferred using a potential inclination referred to as a fringing electric field, but when a pixel size is large, a potential becomes flat with respect to a position at a center of the pixel, and charges tend to be difficult to transfer. Therefore, in a linear image sensor having a large-sized photoelectric conversion region in a length direction, a resistive gate electrode is disposed on the photoelectric conversion region through an insulation film, and a potential inclination is intentionally formed in the photoelectric conversion region.

On the other hand, in a linear image sensor for emission spectral analysis (OES) including laser-induced breakdown analysis (LIBS), a high-speed shutter function has been required. The spectroscopic analysis can be performed by detecting a spectroscopic optical image using the linear image sensor.

In the emission spectral analysis, a distribution and a state of elements contained in an inspected object can be identified by emitting strong excitation light (laser and the like) to the inspected object and performing the spectroscopic analysis on a bright-line spectrum emitted from the inspected object.

CITATION LIST

Patent Literature

[Patent Literature 1] Japanese Unexamined Patent Publication No. 2004-303982

[Patent Literature 2] Japanese Unexamined Patent Publication No. 2012-151364

[Patent Literature 3] Japanese Unexamined Patent Publication No. H6-283704

SUMMARY OF INVENTION

Technical Problem

However, since the plasma generated on a surface of an inspected object by an excitation light contains a lot of background light of the plasma itself immediately after the emission, an element-specific bright-line spectrum of an element to detect is buried therein. Therefore, in order to perform a highly accurate spectroscopic analysis, it is preferable that a signal containing a lot of background light of the plasma itself immediately after the emission, which is generated on a surface of the inspected object by emission of the strong excitation light be removed by an electronic shutter, and selectively detect a signal containing a lot of element-specific bright-line spectrums at an elapse of a certain period of time after the emission. The excitation light is monotonously attenuated immediately after an occurrence thereof and disappears in about 10 micro seconds, such that a removal time of a signal by an electronic shutter is set to a period of a few micro seconds or less.

The linear image sensor performs a reading by converting incident light into electrons (holes) and transferring converted carriers to a terminal portion. For example, the linear image sensor removes charges accumulated from a time of 0 seconds when imaging is started to a time of t1, and transfers charges accumulated from the time of t1 to a time of t2 to a horizontal register.

Here, an electronic shutter which performs a removal of charges removes charges by causing charges from the photoelectric conversion region to immediately before a region directly beneath the transfer gate electrode to flow into a drain.

FIG. 19(A) is a plan view of a structure in a vicinity of one pixel in such a case.

A charge is transferred in a vertical direction by an electronic field created by a resistive gate electrode R provided in the light-sensitive region, and charges accumulated directly beneath a first transfer electrode STG flows in a drain region ARD and being discarded to the outside by applying a predetermined potential to the reset gate electrode ARG for an electronic shutter. When a transfer electrode TG at a terminal is turned on at a time when the charges are not discarded, the charges flow into a region directly beneath a horizontal transfer electrode PH and are read through the horizontal register.

In detail, in order to cause a charge to flow into the drain region ARD, the reset gate electrode ARG is disposed between the charge accumulation region and the drain region, and a clock signal is given to the reset gate electrode ARG with predetermined time intervals. The clock signal is input to the reset gate electrode ARG, and thereby a channel region directly beneath the reset gate electrode ARG is turned on and a charge flows in the drain region ARD from the charge accumulation region to function as a shutter.

However, since a dimension of the photoelectric conversion region in a charge transfer direction is long, there is a time delay between a time when charges transferred to one end of the photoelectric conversion region are accumulated in the charge accumulation region and a time when charges at the other end are transferred and accumulated in the charge accumulation region. That is, in a linear image sensor with such a structure, after this delayed amount of time is elapsed, the charges accumulated in the charge accumulation region are caused to flow into the drain region. In other words, in such a type of linear image sensor, a time at which charges are transferred to the drain region is delayed, and thus it is not possible to shorten an electronic shutter period.

On the other hand, as shown in FIG. 19(B), a long drain region ARD is laterally provided on a side of the photoelectric conversion region in which the resistive gate electrode R is provided, and in the structure in which charges flow into the drain region ARD, charges generated at any region in the photoelectric conversion region can immediately flow into the drain region ARD. However, in order to discharge the charges to the drain region ARD, a long reset gate electrode ARG needs to be laterally disposed in the long drain region, and even though the reset gate electrode ARG and the drain region ARD configure a parasitic element such as a capacitor and a high-speed clock signal is given to the reset gate electrode ARG, a response of a channel region directly beneath the reset gate electrode ARG is delayed and ON/OFF cannot be controlled at a high speed. Therefore, the electronic shutter is not faster.

The present invention is made in a view of such a problem, and aims to provide a linear image sensor capable of speeding up the electronic shutter.

Solution to Problem

In order to solve the problem described above, a linear image sensor according to the present invention includes a plurality of optical detection units aligned in a row direction, and each of which is divided so as to have a plurality of pixel regions aligned in a column direction, integrates signals from the plurality of pixel regions for each of the optical detection units, and outputs electrical signals corresponding to a one-dimensional optical image in time series, in which each of the pixel regions includes a photoelectric conversion region for performing photoelectric conversion on an incident energy beam, potential inclination forming means for forming a potential inclination which promotes transfer of charges in the column direction in the photoelectric conversion region, a charge accumulation region for accumulating each of charges generated in each of the photoelectric conversion regions, a drain region which is adjacent to the charge accumulation region through a channel region, and a reset gate electrode which is disposed on the channel region to control an amount of charges flowing in the channel region.

Charges generated in the photoelectric conversion region can be transferred in a column direction at a high speed by the potential inclination forming means. The transferred charges are transferred to the charge accumulation region through a barrier region.

A drain region is adjacent to each charge accumulation region through a channel region. Whether charges can pass through the channel region depends on a potential given to a reset gate electrode on the channel region. That is, charges flow into the drain region through the channel region from the charge accumulation region when the channel region is turned on by giving a potential to the reset gate electrode.

The linear image sensor can discharge a charge to a drain at a high speed because one pixel is divided into a plurality of photoelectric conversion regions and a drain region is adjacent to each of the photoelectric conversion regions through the channel region. In addition, since a time constant around the drain region is small due to the division, it is possible to easily switch the channel region between ON/OFF by giving a clock signal of a high frequency even to each reset gate electrode.

In addition, a potential barrier region having a lower impurity concentration than the photoelectric conversion region is formed between the charge accumulation region in a pixel region and the photoelectric conversion region in a pixel region adjacent to a rear stage of the pixel region. In this manner, when the potential barrier region having a low impurity concentration is present, it is possible to prevent a charge from reversely flowing to the charge accumulation region of a target pixel region from the pixel region of the rear stage Advantageous Effects of Invention According to the linear image sensor of the present invention, it is possible to speed up the electronic shutter, and thus a precise analysis which was not possible in the related art can be performed by using the high-speed electronic shutter in an emission spectral analysis and the like.

BRIEF DESCRIPTION OF DRAWINGS

FIG. 5 is a chart which shows a change in potentials of each signal.

FIG. 6 is a plan view of a resistive gate electrode.

FIG. 7 is a plan view of a first type of photoelectric conversion region.

FIG. 11(A) is a cross-sectional view (A-A arrow cross-section) of the charge-coupled device shown in FIG. 10, and FIGS. 11(B) and 11(C) are potential diagrams in an X axis direction of the cross-section.

DESCRIPTION OF EMBODIMENTS

Figure 1:
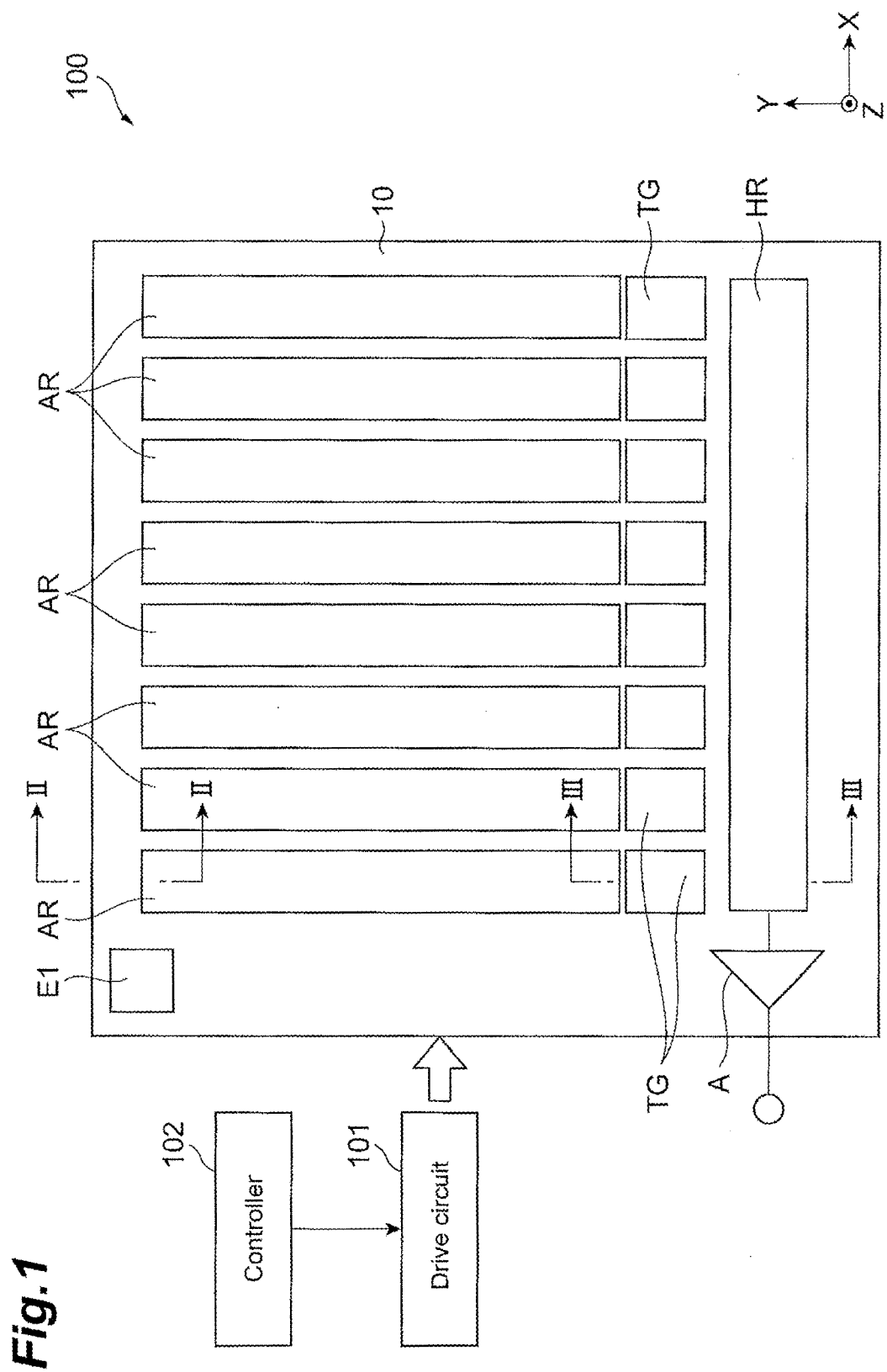
FIG. 1 is a view which shows a planar configuration of a solid-state imaging element including a charge-coupled device.

Hereinafter, a linear image sensor according to an embodiment will be described. The same elements will be denoted by the same reference numerals, and a duplicated description will be omitted.

Figure 2:
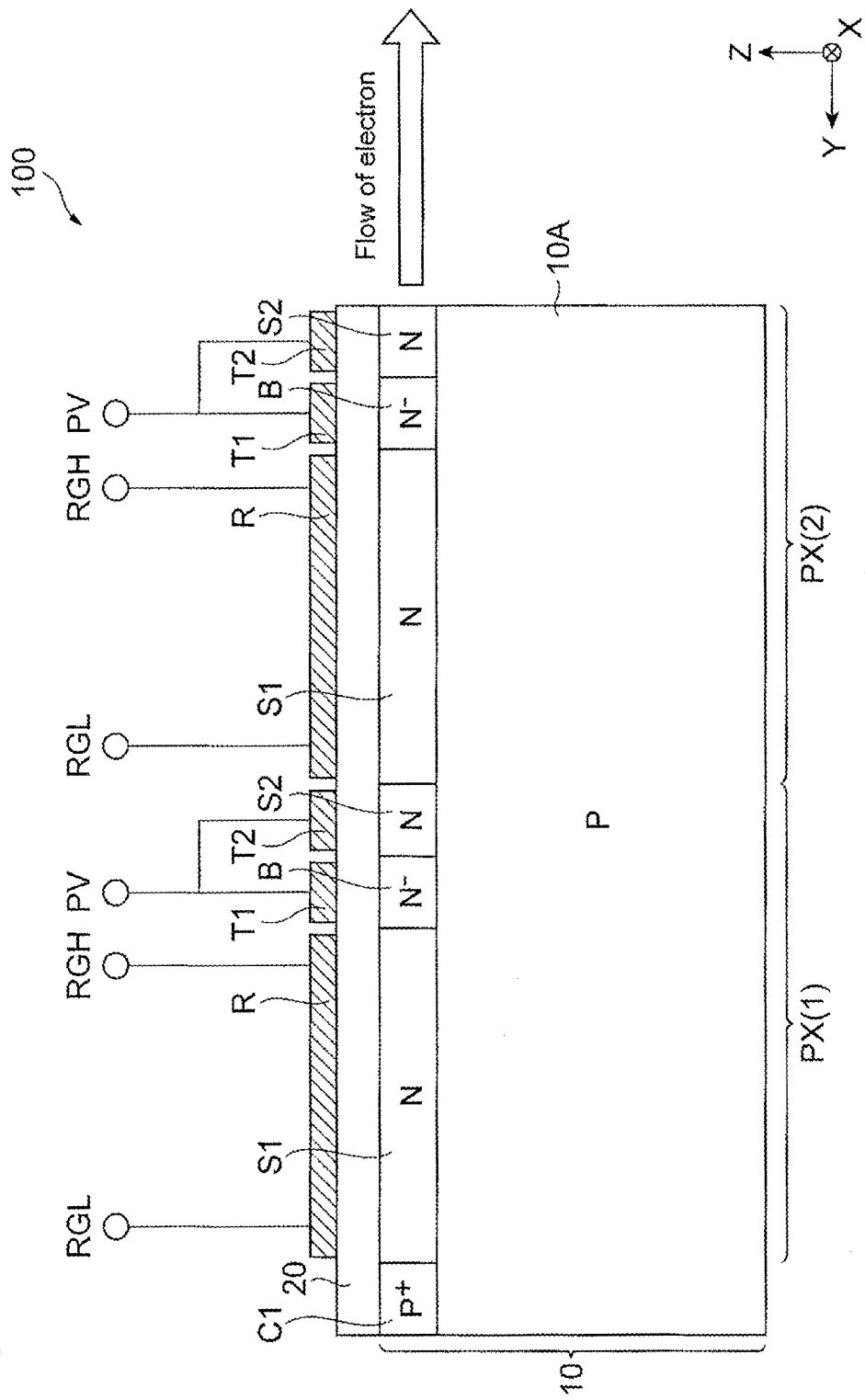
FIG. 2 is a cross-sectional view arrow cross-section) of the linear image sensor shown in FIG. 1.

FIG. 1 is a view which shows a planar configuration of a solid-state imaging element including a linear image sensor 100 configured from a charge-coupled device, and FIG. 2 is a cross-sectional view (II-II arrow cross-section) of the linear image sensor shown in FIG. 1.

A linear image sensor 100 includes a plurality of light detection units (pixel column) AR aligned in a row direction (X axis direction). Each of the optical detection units AR is divided so as to have a plurality of pixel regions PX (PX(1) and PX(2) in FIG. 2) arranged in a column direction (Y axis direction), and a charge generated in each pixel region PX is transferred in the column direction.

The linear image sensor 100 integrates signals from the plurality of pixel regions PX for each optical detection unit AR, and outputs electrical signals corresponding to a one-dimensional optical image incident on the optical detection unit AR in time series.

Each of the pixel regions PX includes a photoelectric conversion region S1 which performs photoelectric conversion on an incident energy beam, a potential inclination forming means (resistive gate electrode R) which forms a potential inclination for promoting transfer of charges in the column direction (Y axis) in the photoelectric conversion region S1, a charge accumulation region S2 which accumulates charges generated in each photoelectric conversion region S1, respectively, a drain region ARD which is adjacent to the charge accumulation region S2 through a channel region B2 (refer to FIG. 11), and a reset gate electrode ARG (refer to FIG. 11) disposed on the channel region B2 so as to control an amount of charges flowing in the channel region B2.

The charges generated in the photoelectric conversion region S1 can be transferred in the column direction (Y axis) at a high speed by the potential inclination forming means. The transferred charges are transferred to the charge accumulation region S2 through a barrier region B (refer to FIG. 2).

As shown in FIG. 2, the linear image sensor 100 includes a semiconductor substrate 10 which has a plurality of pixel regions PX (PX(1), PX(2)) aligned in the Y axis direction (one direction), and an insulation film 20 which is provided on the semiconductor substrate 10. A contact region C1 to which impurities (P-type) are added at a higher concentration than in a semiconductor substrate main body 10A is formed on a surface side of a P-type (first conductivity type) semiconductor substrate 10, and an electrode E1 (refer to FIG. 1) is in contact with the contact region C1 to be electrically connected. The plurality of optical detection units AR (refer to FIG. 1) configuring an imaging region of a line sensor are formed on the surface side of the semiconductor substrate 10, and each optical detection unit AR includes the plurality of pixel regions PX aligned in the Y axis direction. The contact region C1 of FIG. 2 may be formed so as to surround an outer edge of the semiconductor substrate 10.

As shown in FIG. 1, a transfer gate electrode TG for controlling a passage of electrons is provided in a terminal portion of each optical detection unit AR, and a horizontal register HR is disposed through the transfer gate electrode TG. The horizontal register transfers electrons flowing therein in a horizontal direction (X-axis negative direction) through the transfer gate electrode TG The transferred electrons are input to an amplifier A, converted into a voltage, and output to the outside.

As shown in FIG. 2, each of the pixel regions PX includes an N-type (second conductivity type) photoelectric conversion region S1 (a PN junction with a spread depletion layer is formed at an interface between the photoelectric conversion region S1 and the semiconductor substrate main body 10A) which performs photoelectric conversion on an incident energy beam, and a resistive gate electrode R (potential inclination forming means) for forming a potential inclination in one direction in the photoelectric conversion region S1. In addition, each pixel region PX includes a first transfer electrode T1 provided on the insulation film 20, and a second transfer electrode T2 which is provided on the insulation film 20 and is disposed between the first transfer electrode T1 and a pixel region PX (2) adjacent to the pixel region PX (1). Moreover, each of the pixel regions PX includes a barrier region B positioned directly beneath the first transfer electrode T1 in the semiconductor substrate 10, and a charge accumulation region S2 positioned directly beneath the second transfer electrode T2 in the semiconductor substrate 10.

Here, an impurity concentration (second conductivity type: N type) of the barrier region B is lower than an impurity concentration (N-type) of the charge accumulation region S2, and the first transfer electrode T1 and the second transfer electrode T2 are electrically connected to each other.

In the present embodiment, the potential inclination forming means is positioned directly above the photoelectric conversion region S1 and is the resistive gate electrode R provided on the insulation film 20. Even if a predetermined fixed voltage is applied across both ends of the resistive gate electrode R in the Y axis direction from a drive circuit 101 shown in FIG. 1, the potential inclination forming means can be configured even using a two-dimensional impurity concentration distribution on a surface of the semiconductor substrate. The potential inclination forming means promotes transfer of charges in the charge transfer direction (Y axis).

When the resistive gate electrode R is used, it is possible to create a potential inclination in a semiconductor region directly beneath the resistive gate electrode by disposing the resistive gate electrode R on the insulation film 20 and applying a fixed voltage across both ends of the resistive gate electrode. Here, a potential RGL is added to a front stage in an electron transfer direction in the resistive gate electrode R, and a potential RGH (>RGL) is added to a rear stage. These potentials are voltages based on a ground. Since the rear stage side has a higher potential, electrons having a negative charge flow into the rear stage with a high potential. Accordingly, even when a pixel with a large area is used, it is possible to sufficiently transfer a charge.

Even when a pixel size is large, charges generated in the photoelectric conversion region can be sufficiently transferred in one direction by the resistive gate electrode R. The transferred charges are transferred to the charge accumulation region S2 through the barrier region B. A potential in a non-bias state of the barrier region B and the charge accumulation region S2 varies with an impurity concentration difference, and the charge accumulation region S2 is deep and easily accumulates charges. On the other hand, the same bias is applied to the barrier region B and the charge accumulation region S2 through the insulation film by the first transfer electrode T1 and the second transfer electrode T2 electrically connected to each other. Accordingly, it is possible to accumulate (a first state) charges in the charge accumulation region S2 through the barrier region B and to transfer (a second state) the accumulated charges to a pixel at a rear stage by raising or lowering a potential (transfer signal PV) applied to the first transfer electrode T1 and the second transfer electrode T2.

It is possible to apply a potential to the resistive gate electrode R and the transfer electrodes T1 and T2 from the drive circuit 101. The drive circuit 101 is controlled by a controller 102. The controller 102 is configured from a microcomputer or the like, and sends a clock signal which is programmed in advance to the drive circuit 101 according to a control input into the controller 102. When a predetermined clock signal is input to the drive circuit 101, the drive circuit 101 generates constant voltages RGL and RGH and a one-phase transfer signal PV. For example, the drive circuit 101 detects an input start of a clock signal, generates the constant voltage RGL and RGH during a certain period of time, divides the clock signal when needed, raises a potential of the transfer signal PV at a rising timing of the divided clock signal, and lowers the potential of the transfer signal PV at a falling timing.

That is, the solid-state imaging element includes the linear image sensor 100, the drive circuit 101 for driving the linear image sensor 100, and the controller 102 for controlling the drive circuit 101, and the controller 102 controls the drive circuit 101 so that potentials of the first transfer electrode T1 and the second transfer electrode T2 vertically vibrate at the same time due to an application of the transfer signal PV. In this case, it is possible to alternately create "the first state" and "the second state" described above by raising or lowering a potential.

Figure 18:
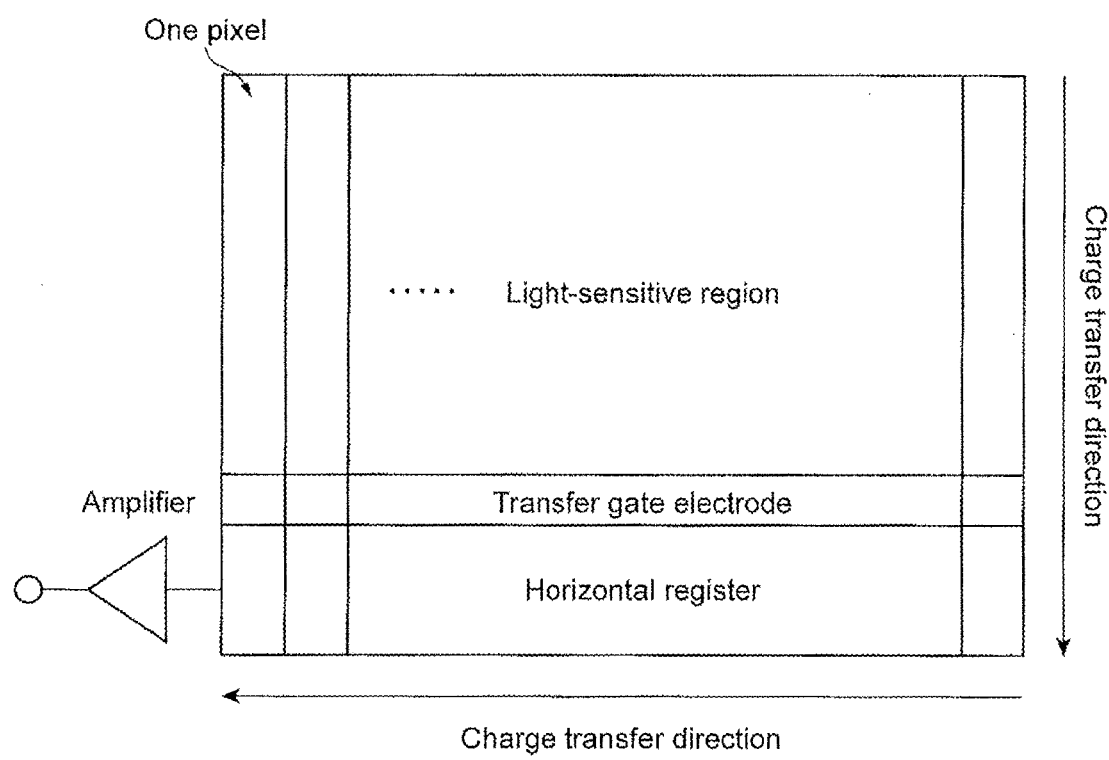
FIG. 18 is a plan view of a conventional linear image sensor.
Figure 19:
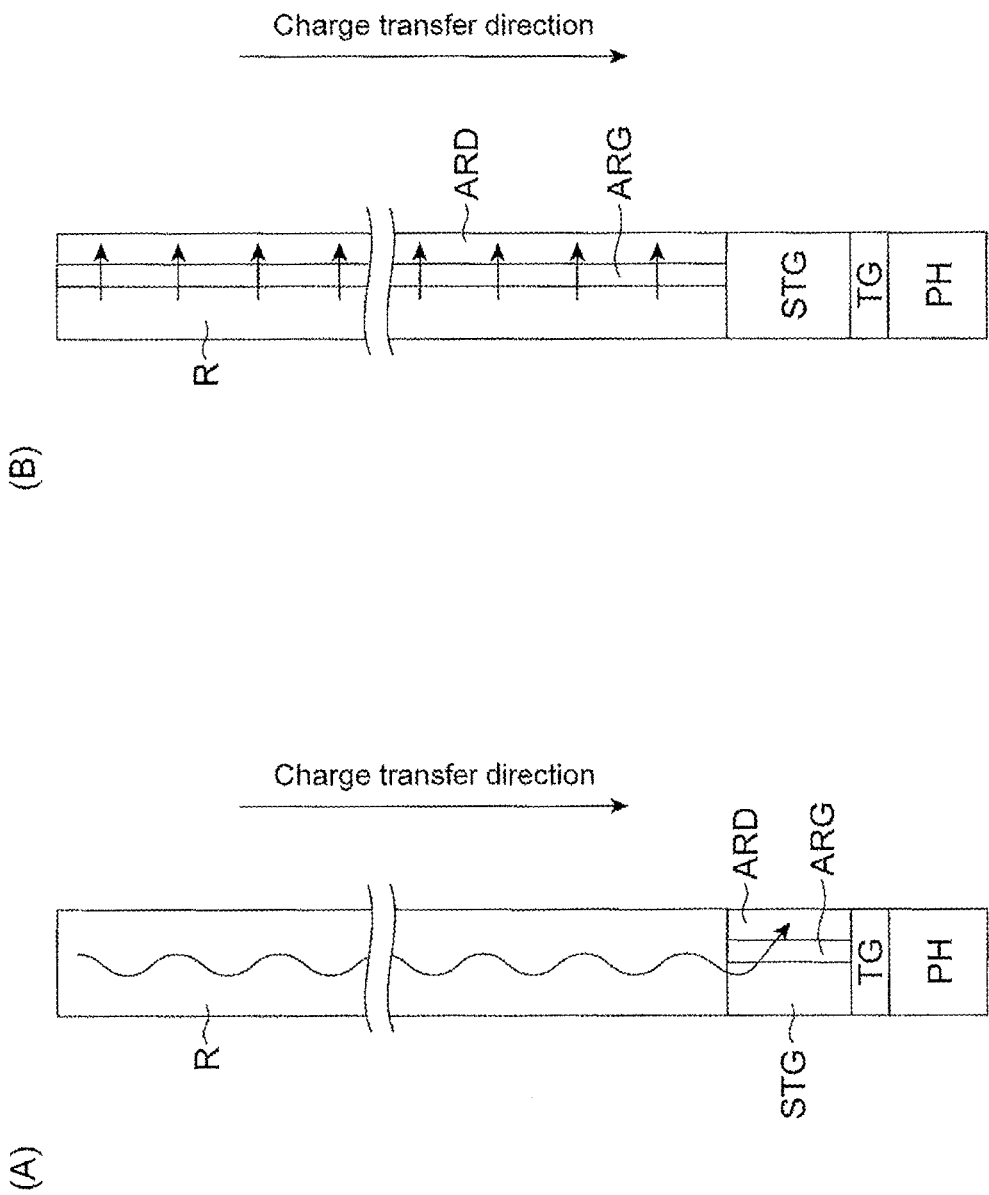
FIGS. 19(A) and 19(B) are plan views of a structure in a vicinity of one pixel.

The first transfer electrode T1 and the second transfer electrode T2 can be shared as shown in FIG. 18. The common transfer electrode is set to be STG.

Figure 3:
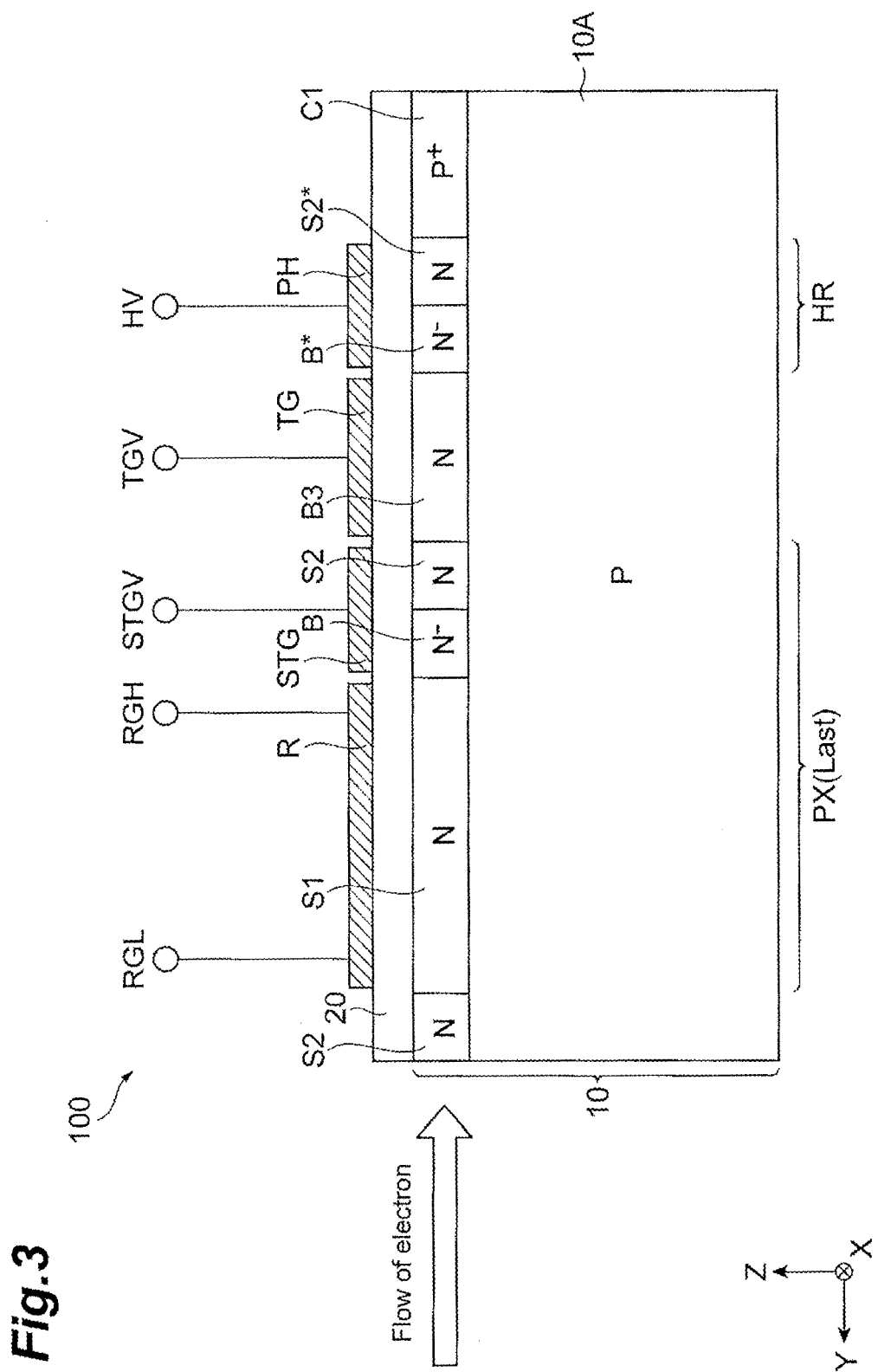
FIG. 3 is a cross-sectional view (III-III arrow cross-section) of the linear image sensor shown in FIG. 1.

FIG. 3 is a cross-sectional view (III-III arrow cross-section) of the linear image sensor shown in FIG. 1.

Electrons transferred to a terminal of a vertical optical detection unit AR are accumulated in the charge accumulation region S2 through the barrier region B of a last pixel region PX (last). The linear image sensor is formed on the insulation film 20, and includes a transfer electrode STG provided on the last barrier region B and the charge accumulation region S2. The transfer gate electrode TG is disposed next to the transfer electrode STG, and charges accumulated through an N-type channel region B3 directly beneath the transfer gate electrode TG can flow into a region directly beneath the horizontal transfer electrode PH.

A structure directly beneath the horizontal transfer electrode PH is the same as a structure directly beneath the transfer electrode STG, and includes a barrier region B* and a charge accumulation region S2* adjacent to each other in the Y axis direction. An impurity concentration of the channel region B3 is set to be lower than that of the charge accumulation region S2, and charges are likely to be accumulated in the charge accumulation region S2. Structures of the barrier region B* and the charge accumulation region S2* are the same as those of the barrier region B and the charge accumulation region S2.

Here, a transfer signal TGV given to the transfer gate electrode TG is a signal for performing a binning operation. The binning operation is performed as follows. In a first stage, the transfer signal TGV has a potential lower than a reference value and the channel region B3 directly beneath the transfer gate electrode TG is made to serve as a potential barrier with respect to the charge accumulation region S2, and thereby charges are accumulated in the charge accumulation region S2. In a second stage, the charges are transferred to a charge accumulation region S2* of a horizontal register through the channel region B3 and a barrier region B* of the horizontal register from the charge accumulation region S2 in the last pixel region by increasing the potential of the transfer signal TGV and reducing a potential barrier with respect to the charge accumulation region S2. In a third stage, the charges of a pixel region of the front stage are gradually transferred toward the charge accumulation region S2* of the horizontal register and integrated by repeating the first state and the second state described above while giving a high voltage to the transfer signal TGV. In a fourth stage, after charges of one vertical pixel region all flow into the charge accumulation region S2* of the horizontal register and are integrated, a potential barrier is formed by giving a low voltage to the transfer signal TGV, and charge transfer to directly beneath the horizontal transfer electrode PH ends.

Charges accumulated in the charge accumulation region S2* of the horizontal register are transferred in a horizontal direction by applying a horizontal transfer signal HV to a horizontal transfer electrode PH provided on the insulation film 20, but the transfer signal HV and a transfer signal TGV applied to the transfer gate electrode TG are also generated by the drive circuit 101 according to an instruction of the controller 102.

Figure 4:
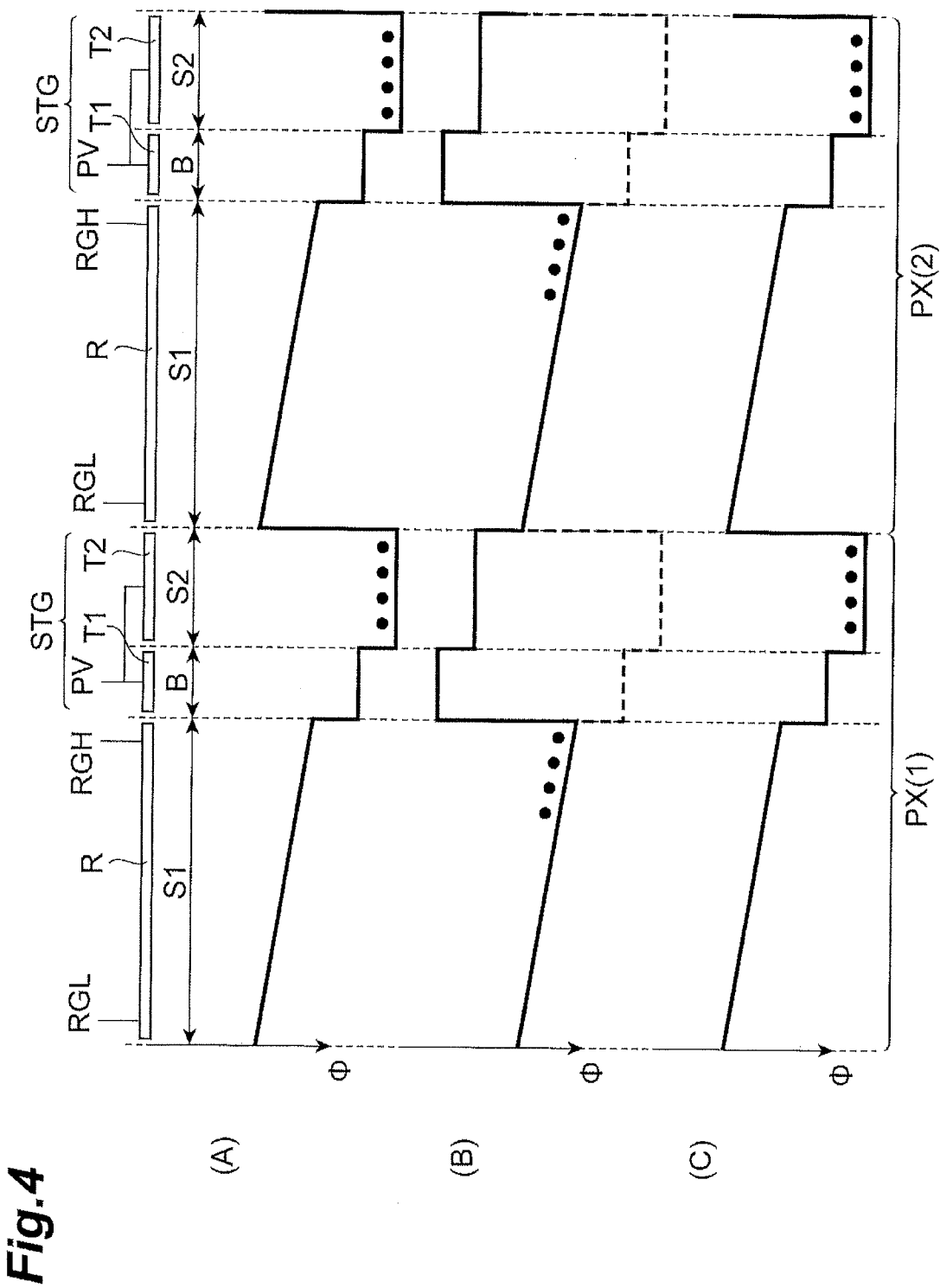
FIG. 4 is a view for describing a potential change in a light detector in a vertical direction.

FIG. 4 is a view for describing a potential change in a light detector in a vertical direction, and FIG. 5 is a chart which shows a change in potentials of each signal. In a following chart, a potential is represented by $\phi$, and a downward direction of the drawing is a positive direction.

In all periods t1 to t2 (refer to FIG. 5) in which a charge transfer is performed, the potentials RGL and RGH applied to both ends of the resistive gate electrode R are constant. Of course, a charge transfer may be performed in a photoelectric conversion region while performing photoelectric conversion after the potentials RGL and RGH are applied, but electrons may be accumulated without applying a voltage across both ends of the resistive gate electrode R during the photoelectric conversion, and thereafter, a voltage may be given only during the charge transfer.

In a first period t1, as shown in (A) of FIG. 4, a potential of the photoelectric conversion region S1 disposed in the resistive gate electrode R becomes deeper in a transfer direction (right side of the drawing: the Y-axis negative direction in FIG. 1) of electrons (black circles), a potential of the barrier region B directly beneath the first transfer electrode T1 becomes largely deeper, and becomes far deeper in the charge accumulation region S2 directly beneath the second transfer electrode T2. The charge accumulation region S2 is superimposed between an adjacent barrier region B and an adjacent photoelectric conversion region S1 of a rear stage, and forms a potential well. In a state of (A), a potential higher than the reference value is added to both the first transfer electrode T1 and the second transfer electrode T2 by a transfer signal PV.

In a second period t2, as shown in (B) of FIG. 4, there is no change in a potential of the photoelectric conversion region S1 disposed in the resistive gate electrode R, but a potential of the barrier region B directly beneath the first transfer electrode T1 is smaller than the potential of the photoelectric conversion region S1, and thereby a potential barrier is configured. Since a potential of the charge accumulation region S2 is deeper than a potential of the barrier region B, and is shallower than a potential of the photoelectric conversion region S1 of a rear stage, electrons accumulated in the charge accumulation region S2 flow into the photoelectric conversion region of a rear stage, but the electrons are blocked by the potential barrier formed by the barrier region B (buffer region) and are temporarily accumulated at a right end of the drawing of the photoelectric conversion region S1.

Thereafter, operations in the first period t1 and the second period t2 are repeated. That is, the first period t1 is repeated after the period of (B) of FIG. 4. In this case, as shown in (C) of FIG. 4, there is no change in the potential of the photoelectric conversion region S1 disposed in the resistive gate electrode R, but the potentials of the barrier region B and the photoelectric conversion region S1 are changed to be the same as in the first period t1, and the same operation as in the first period is performed. Moreover, in a next period, the potentials of the barrier region B and the photoelectric conversion region S1 are changed to be the same as in the second period t2, and the same operation as in the second period is performed.

Next, potential inclination forming means will be described.

FIG. 6 is a plan view of a resistive gate electrode as the potential inclination forming means. The resistive gate electrode R is made of a poly-silicon having lower resistivity than, for example, the photoelectric conversion region S1. An appropriate resistance value across both ends of a resistor R can be set to be 1 kΩ to 10 MΩ. The resistive gate electrode R configures a rectangle in an XY plane, but can have another polygonal shape such as a trapezoid. The potentials RGL and RGH are given to both ends of the resistive gate electrode R, and a potential inclination which promotes a charge transfer in the charge transfer direction is formed.

FIG. 7 is a plan view of a first type of photoelectric conversion region as potential inclination forming means. That is, the same potential inclination is formed by changing an impurity concentration of the photoelectric conversion region S1 without using the resistive gate electrode R described above in the embodiment. Electrons are transferred in a right direction of the drawing, but an impurity concentration of a rear stage side region S12 of the charge transfer is set to be higher than an impurity concentration of a front stage side region S11 of the charge transfer. Even in this case, a potential of the rear stage side region S12 is deeper than a potential of the front stage side region S11, and an inclined fringing electric field is formed in a vicinity of the boundary of the front stage side region S11 and rear stage side region S12. That is, a potential inclination which promotes charge transfer in a charge transfer direction is formed.

Figure 8:
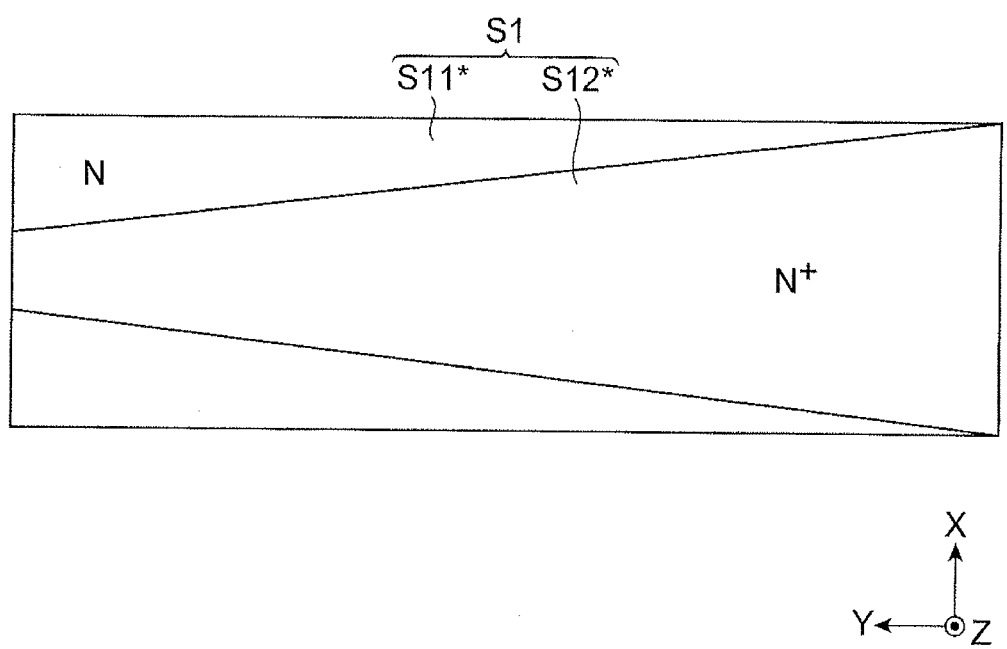
FIG. 8 is a plan view of a second type of photoelectric conversion region.

FIG. 8 is a plan view of a second type of photoelectric conversion region as the potential inclination forming means. That is, in the embodiment, the same potential inclination is also formed by changing the impurity concentration of the photoelectric conversion region S1 without using the resistive gate electrode R described above. Electrons are transferred in a right direction of the drawing, but a trapezoidal taper region S12 whose width in an X axis direction is narrowed toward a direction opposite to the charge transfer direction (Y direction) extends so as to cross a remaining photoelectric conversion region S11 in the Y axis direction. The impurity concentration of the taper region S12 is set to be higher than the impurity concentration of the photoelectric conversion region S11. Even in this case, an average potential of the width direction in the rear stage side region of the charge transfer direction is deeper than in the front stage side region, and a potential inclination which promotes charge transfer in the charge transfer direction is formed in the photoelectric conversion region S1.

Figure 9:
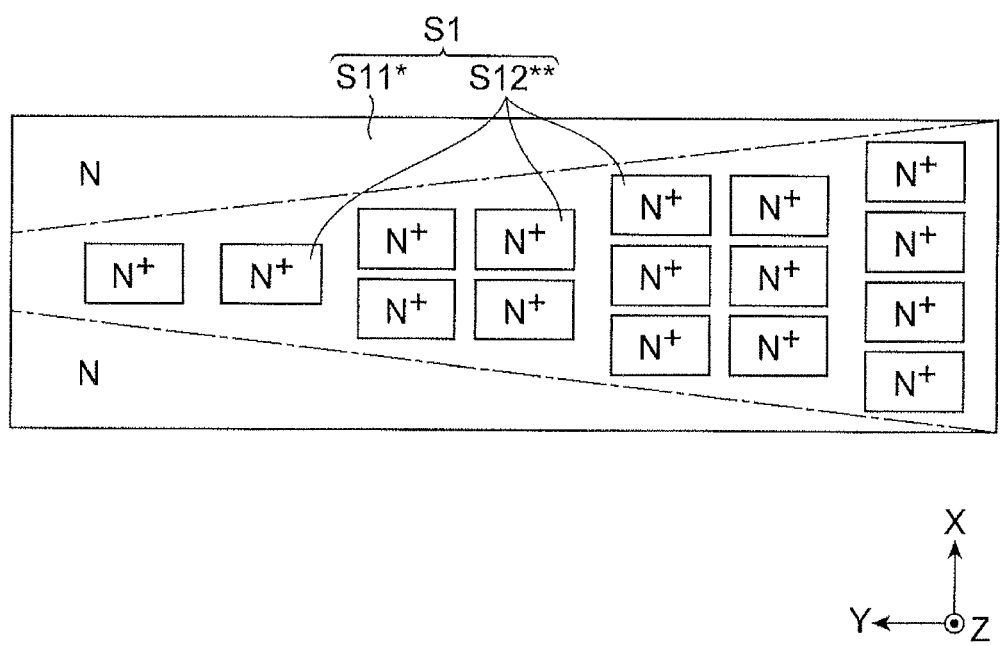
FIG. 9 is a plan view of a third type of photoelectric conversion region.

FIG. 9 is a plan view of a third type of photoelectric conversion region as the potential inclination forming means. That is, in the embodiment, the same potential inclination is formed by changing the impurities of the photoelectric conversion region without using the resistive gate electrode R described above. In the photoelectric conversion region S1 of the embodiment, the taper region S12* in the second embodiment is replaced with a plurality of micro semiconductor regions S12, and a shape of each of the micro semiconductor regions S12 is a polygon such as a rectangle, but a maximum value of a distance between both ends of the plurality of micro semiconductor regions S12** in a width direction (X axis direction) is smaller toward a direction (Y-axis positive direction) opposite to the charge transfer direction.

The impurity concentration of the micro semiconductor regions S12** is set to be higher than the impurity concentration of the remaining photoelectric conversion region S11. Even in this case, an average potential of the width direction in the rear stage side region of the charge transfer direction is deeper than in the front stage side region, and a potential inclination which promotes transfer of charges in the charge transfer direction is formed in the photoelectric conversion region S1.

Figure 10:
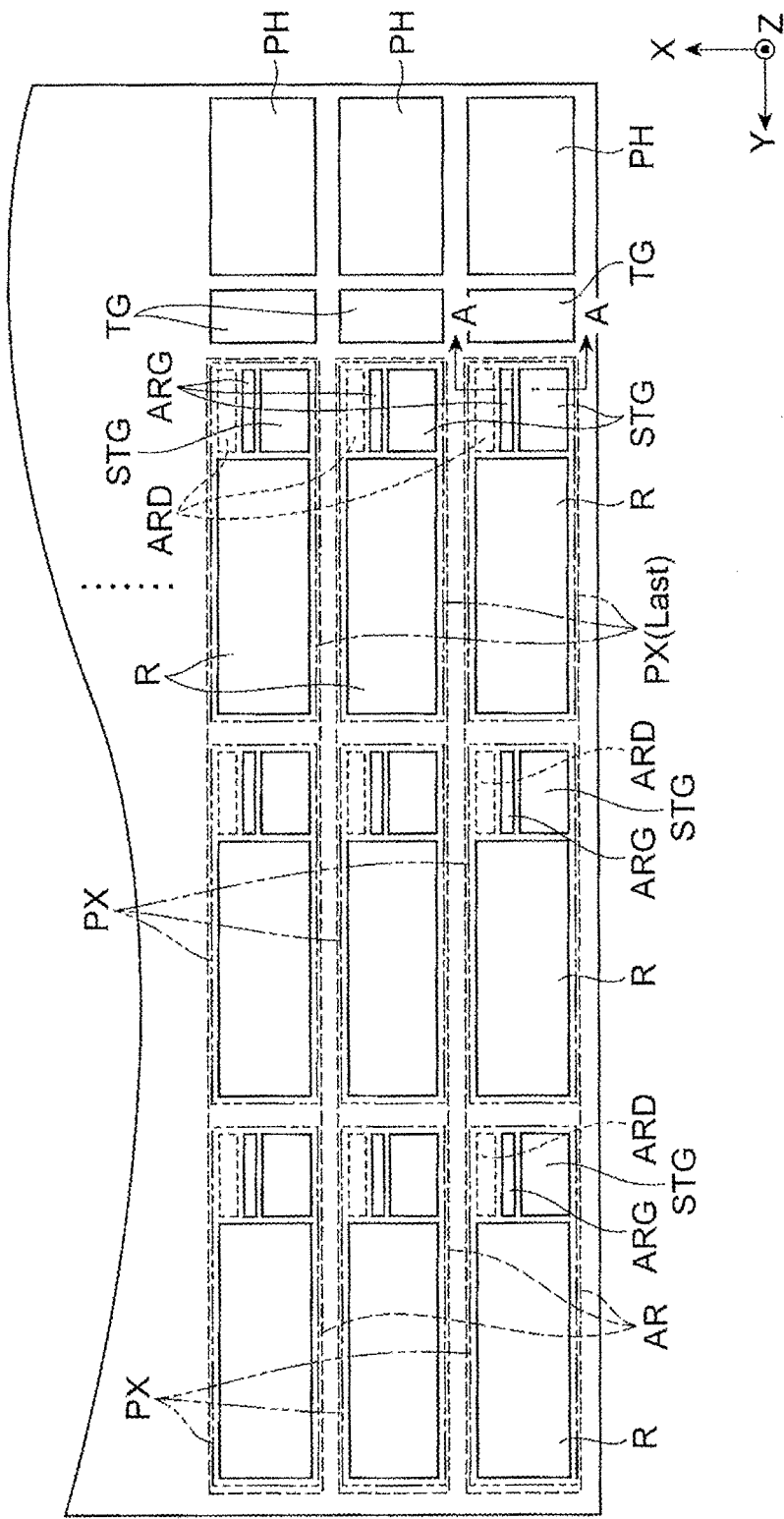
FIG. 10 is a partial plan view of a linear image sensor.

FIG. 10 is a partial plan view of a linear image sensor for describing a terminal portion of the vertical pixel column.

The transfer electrode STG, the transfer gate electrode TG, and the horizontal transfer electrode PH described above are lined up at a terminal of the optical detection unit made of the plurality of pixel regions PX in the negative direction of the Y-axis. In each pixel region PX, the transfer electrode STG, the reset gate electrode ARG, and the drain region ARD are lined up in the X axis direction. Charges accumulated in a region directly beneath the transfer electrode STG in each pixel region can flow into the drain region ARD through a channel region directly beneath the reset gate electrode ARG.

FIG. 11(A) is a cross-sectional view (A-A arrow cross-section) of the linear image sensor shown in FIG. 10, and FIGS. 11(B) and 11(C) are potential diagrams in an X axis direction of the cross-section. Since structures of all pixel regions are the same as this, S2 is used as a sign of the charge accumulation region.

A reset gate electrode ARG is formed on the insulation film 20 adjacent to the X axis direction of the transfer electrode STG. The channel region B2 which is adjacent to the charge accumulation region S2 and having a lower impurity concentration than the charge accumulation region S2 is formed directly beneath the reset gate electrode ARG, and the drain region ARD is formed adjacent to the channel region B2. An impurity concentration of the drain region ARD is higher than that of the charge accumulation region S2. When a potential lower than a reference is given to the reset gate electrode ARG (B), a potential barrier is formed in the channel region B2 and electrons are accumulated in the charge accumulation region S2, but when a potential higher than the reference is given (C), the potential barrier is disappeared and electrons (black circles) flow into the drain region ARD. A timing when a high potential is given to the reset gate electrode ARG is a timing to run an electronic shutter.

The drain region ARD is adjacent to each charge accumulation region S2 through the channel region B2. Whether a charge passes through the channel region B2 depends on a potential given to the reset gate electrode ARG on the channel region B2. That is, when the channel region 132 is turned on by giving a potential higher than the reference to the reset gate electrode ARG, a charge flows into the drain region ARD through the channel region B2 from the charge accumulation region S2.

The linear image sensor can discharge a charge to the drain region ARD at a high speed because one optical detection unit is divided into a plurality of photoelectric conversion regions and the drain region ARD is adjacent to each of the plurality of photoelectric conversion regions through the channel region B2. In addition, since a time constant around the drain region is small due to the division, it is possible to easily switch a channel between ON/OFF by giving a clock signal of a high frequency even to each reset gate electrode ARG.

Figure 12:
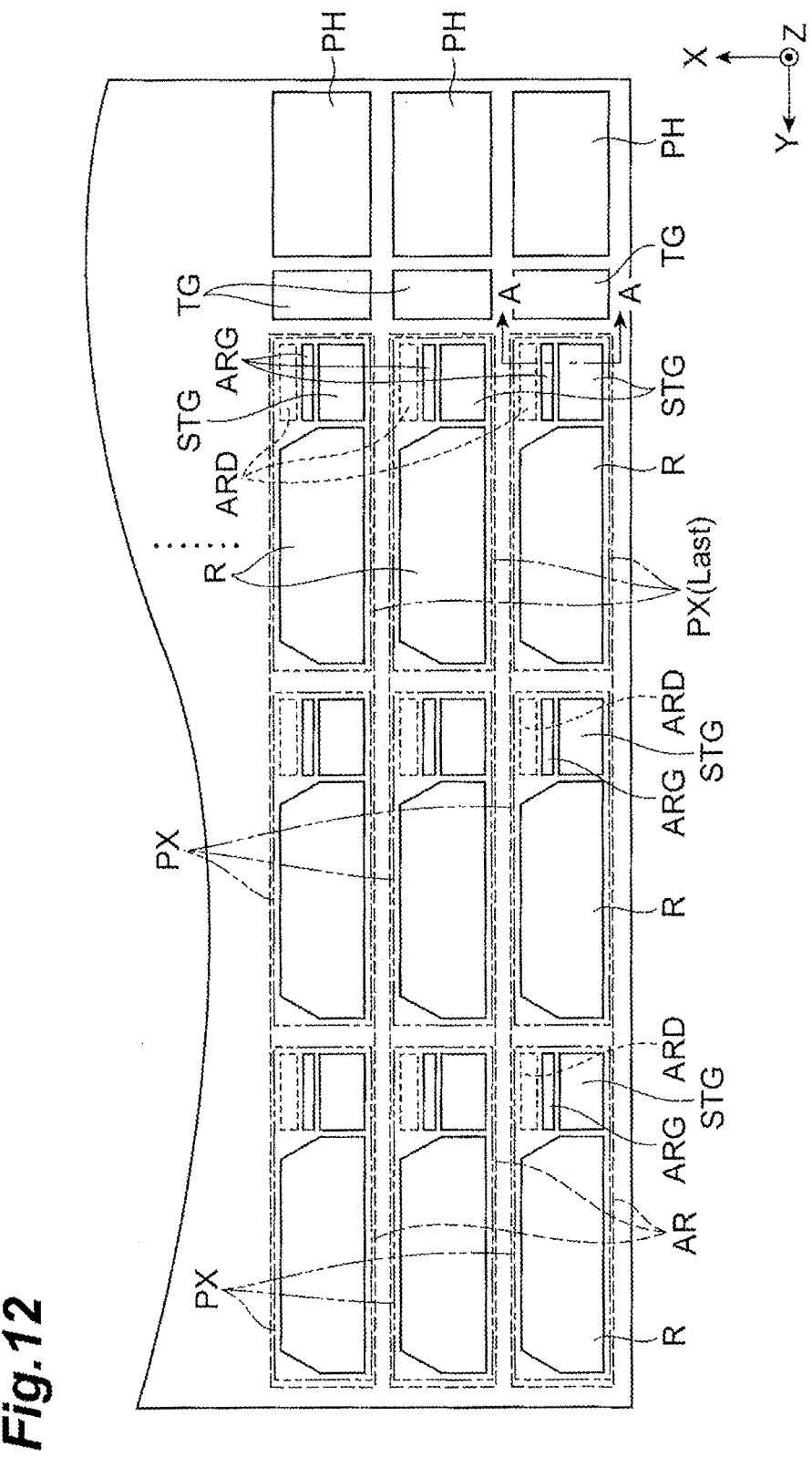
FIG. 12 is a partial plan view of the linear image sensor.

FIG. 12 is a partial plan view of the linear image sensor when a planar shape of each photoelectric conversion region S1 (resistive gate electrode R) is deformed. A cross-sectional structure in the X axis direction through the transfer electrode STG is the same as shown in FIG. 11. Moreover, a planar shape of the resistive gate electrode R is the same as a planar shape of the photoelectric conversion region S1 directly beneath the resistive gate electrode.

The only difference from the structure shown in FIG. 10 is a planar shape of each photoelectric conversion region S1 (resistive gate electrode R) in each pixel region PX, and the other configurations are the same as in FIG. 10. An XY planar shape of the resistive gate electrode R in the pixel region PX is a shape obtained by cutting two corners of a rectangle, and is narrowed in width at both ends of the resistive gate electrode R. As a result, it is possible to transfer the transferred charges to a region directly beneath the transfer electrode STG without leading them to the drain region ARD.

Figure 13:
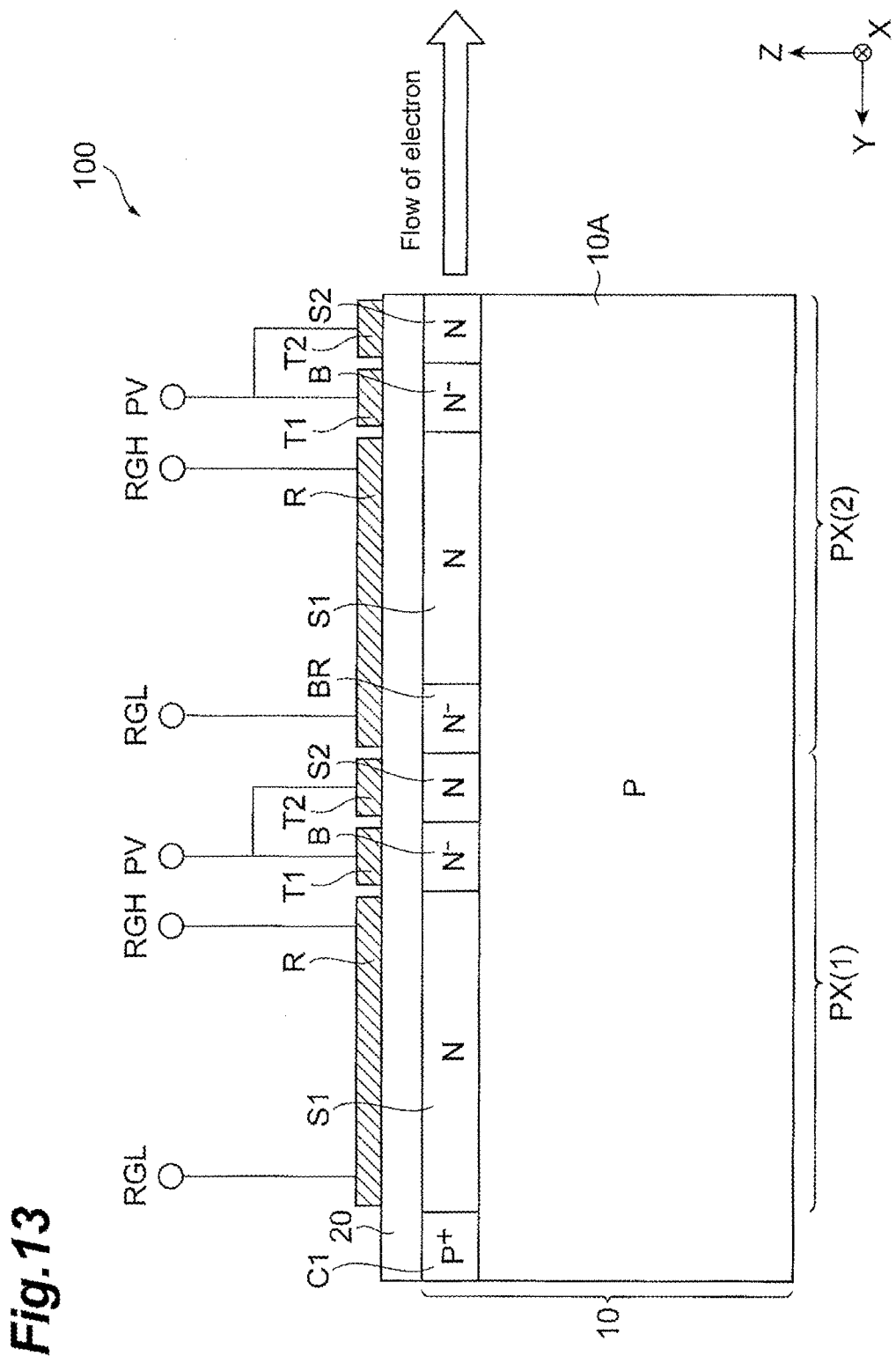
FIG. 13 is a cross-sectional view of a linear image sensor according to a modified structure.
Figure 14:
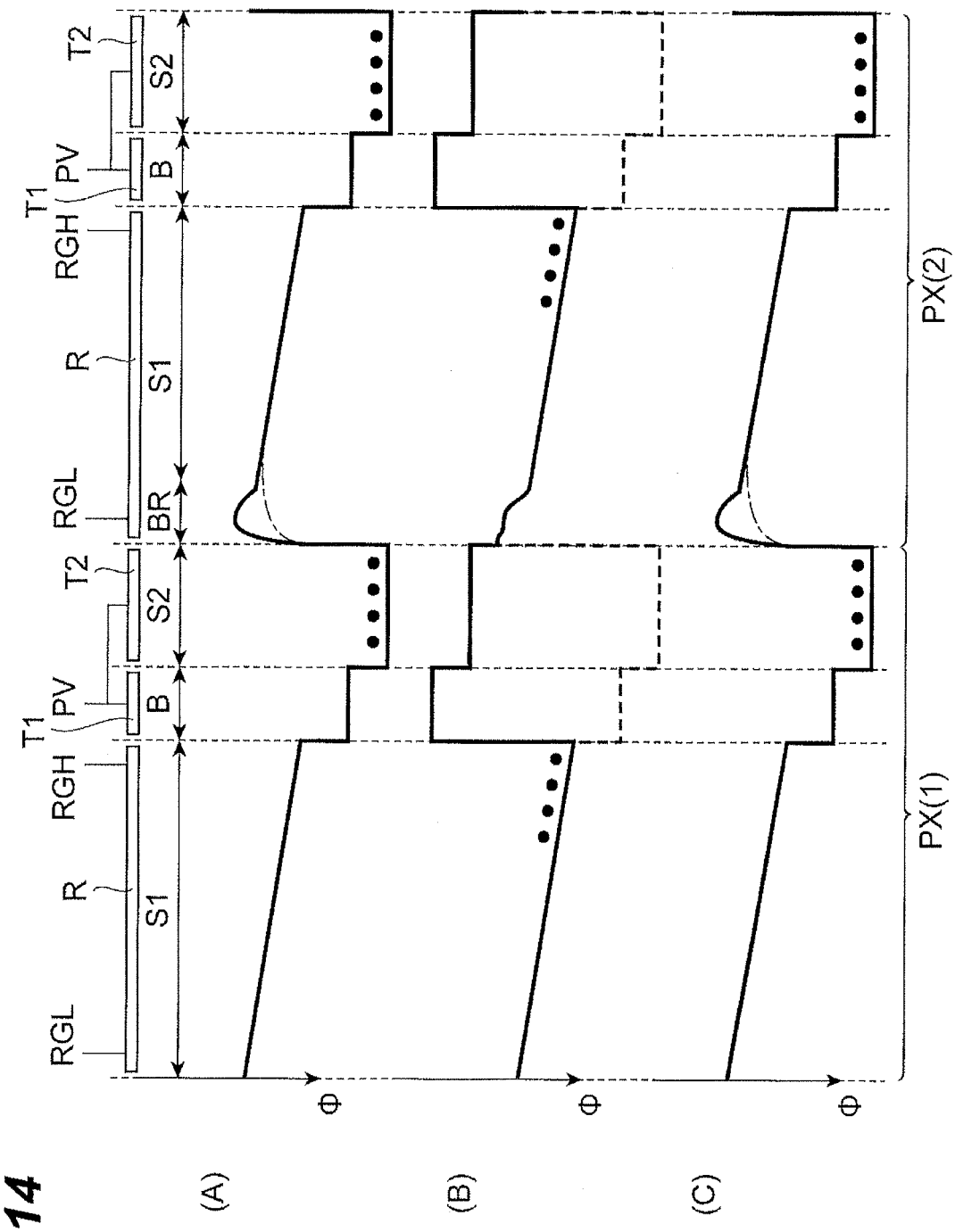
FIG. 14 is a view for describing a potential change in a vertical pixel column.

FIG. 13 is a cross-sectional view of a linear image sensor according to a modified structure, and FIG. 14 is a view for describing a potential change in a vertical optical detection unit. A difference between a structure shown in FIG. 13 and the structure shown in FIG. 2 is that the potential barrier region BR having a low impurity concentration is provided on a front stage side of the photoelectric conversion region S1 in the charge transfer direction, and the other configurations are the same as each other.

In other words, an N-type potential barrier region BR having a lower impurity concentration than the photoelectric conversion region S1 is formed between the charge accumulation region S2 in a certain pixel region PX (1) and the photoelectric conversion region S1 in a pixel region PX (2) adjacent to a rear stage of the pixel region PX (1). In this manner, when there is a potential barrier region BR having a low impurity concentration, it is possible to prevent a charge from reversely flowing to the charge accumulation region S2 of a target pixel region from the pixel region PX (2) of the rear stage.

That is, (A), (B), and (C) of FIG. 14 are views corresponding to states of (A), (B), and (C) of FIG. 2, respectively. The potential barrier region BR suppresses unnecessary transfer of electrons (black circles) to a pixel region PX (2) of a next stage in a state of (A), and moreover, when returned to a state of (A) from a state of (C), the potential barrier region BR prevents an electron from reversely flowing.

Figure 15:
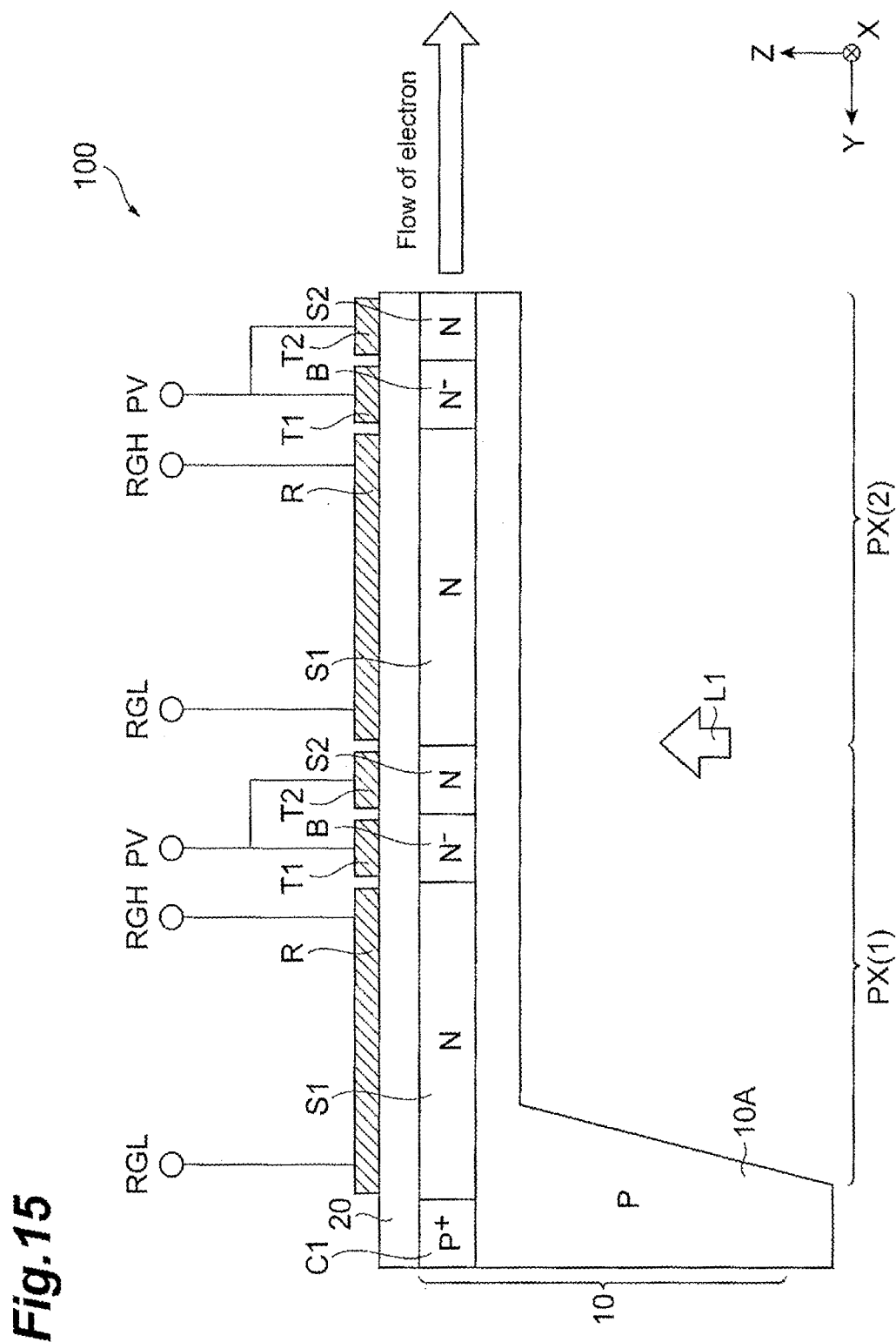
FIG. 15 is a partial cross-sectional view of a back-side illuminated linear image sensor.

FIG. 15 is a partial cross-sectional view of a back-side illuminated linear image sensor.

A difference from the structure shown in FIG. 2 of the embodiment is that the semiconductor substrate main body 10A is configured to be thin from a rear surface side by etching and causes incident light L1 to be incident from the rear surface. A thickness of a peripheral portion of the semiconductor substrate main body 10A is set to be thicker than a thickness of a central portion, and the thickness of the central portion is set to be, for example, 5 μm to 100 μm. In this structure, since there is no electrode to block light incident on the photoelectric conversion region S1, high sensitivity imaging becomes possible.

Figure 16:
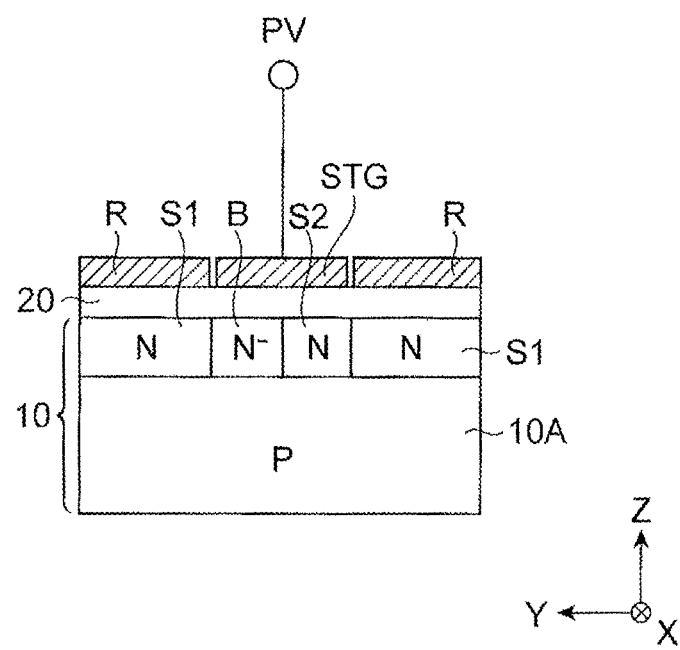
FIG. 16 is a cross-sectional view of a vicinity of a transfer electrode of the linear image sensor when a transfer electrode is shared.

FIG. 16 is a cross-sectional view of a vicinity of a transfer electrode of the linear image sensor when a transfer electrode is shared.

That is, as described above, the first transfer electrode T1 and the second transfer electrode T2 are configured from one common electrode STG. In this case, there is an effect that the structure is simplified.

In a method of manufacturing a charge-coupled device, which manufactures a charge-coupled device including the common transfer electrode STG, the barrier region B can be formed by adding P-type (first conductivity type) impurities to an N-type (second conductivity type) semiconductor region and performing a carrier compensation. That is, the barrier region B of a low concentration can be easily formed by the carrier compensation.

Hereinafter, this will be described in detail.

Figure 17:
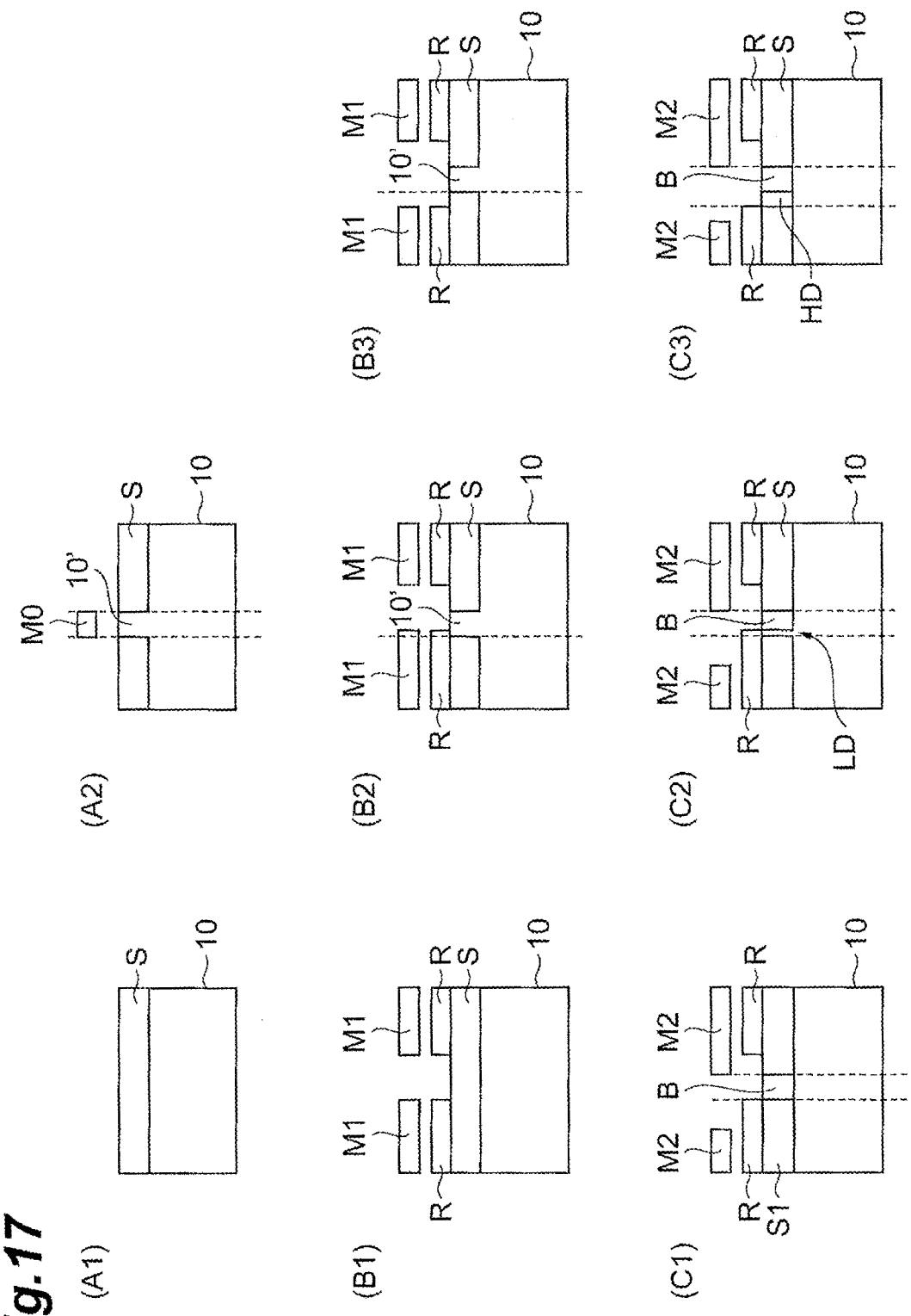
FIG. 17 is a view for describing a method of implanting impurities.

FIG. 17 is a view for describing a method of implanting impurities.

First, N-type impurities are added to an entire surface of a P-type semiconductor substrate 10 by ion implantation, and an N-type semiconductor region S is formed (A1). Next, a resistive layer R made of poly-silicon and the like is formed on the N-type semiconductor region S. A sputtering method and the like can be used in the formation. Next, a mask M1 having an opening is formed on the resistive layer R, and the resistive layer R is etched to be patterned using the mask M1 (B1). Moreover, another mask M2 is prepared, an opening position of the resistive layer R and an opening position of the mask M2 are shifted, the mask M2 is disposed so as to overlap only a portion of the opening of the resistive layer, the P-type impurity is implanted and added in the N-type semiconductor region S using an opening edge of the mask M2 and an opening edge (self-alignment) of the resistive layer R, and a carrier of the added region is compensated to form the barrier region B described above (C1). In addition, the insulation film 20 on the semiconductor substrate is formed prior to a formation of the resistive layer R, and the resistive layer and the above-mentioned electrode are patterned on the insulation film 20 in a usual method, but this is not described in FIG. 17.

Furthermore, the barrier region B can be also formed by using a method of not performing the carrier compensation, but in this case, since self-alignment due to the opening of the resistive layer cannot be used, positional accuracy in the formation of the barrier region is not high compared with the method of using the carrier compensation.

In a case of the method of not using the carrier compensation, first, a mask M0 is disposed on a surface side of the P-type semiconductor substrate 10, and the N-type impurities are implanted and added to form the N-type semiconductor region S (A2). Impurities are not added to a region 10' directly beneath the mask M0. Next, the resistive layer R made of poly-silicon and the like is formed on an entire surface of the semiconductor substrate 10, the mask M1 having an opening is disposed on the resistive layer R, and the resistive layer R is etched using the mask M1 to perform patterning. In this case, the opening position of the patterned resistive layer R and the region 10' in which impurities are not added to the surface of the semiconductor substrate 10 are slightly shifted due to alignment accuracy of the mask M1.

Next, another mask M2 is prepared, the opening position of the resistive layer R and the opening position of the mask M2 are shifted, the mask M2 is disposed so as to overlap only a portion of the opening of the resistive layer, and N-type impurities of a low concentration are implanted and added in the P-type region 10' rather than the N-type semiconductor region to form the N-type barrier region B using an opening of the mask M2 and an opening (self-alignment) of the resistive layer R. In this case, a position of the barrier region B is not as accurate as in the above method.

That is, in the above process (B2), when a position of a left edge of the opening of the mask M1 is further shifted to the right side from a left edge of the region 10', a region LD to which the N-type impurities are not added is formed on a left side of the barrier region B as shown in (C2).

On the other hand, in the above process (B2), when the position of a left edge of an opening of the mask M1 is further shifted to the left side from the left edge of the region 10' (indicated as (B3)), a region HD to which the N-type impurities are added at a high concentration is formed on the right side of the barrier region B as shown in (C3).

Finally, materials will be described.

The semiconductor substrate 10 described above is made of silicon (Si), the N-type impurities added to the barrier region and the charge accumulation region can be set to be N, P, or As, and the P-type impurities can be set to be B or Al. Preferred values of impurity concentration and thickness of each element are as follows.

Semiconductor substrate main body 10A:
$10^{13}$ to $10^{19}$ (cm$^{-3}$)/50000 to 800000 (nm)
Photoelectric conversion region S1:
$10^{12}$ to $10^{17}$ (cm$^{-3}$)/100 to 5000 (nm)
Barrier region B:
$10^{11}$ to $10^{17}$ (cm$^{-3}$)/100 to 000 (nm)
Charge accumulation region S2:
$10^{12}$ to $10^{17}$ (cm$^{-3}$)/100 to 5000 (nm)
Region S11:
$10^{12}$ to $10^{18}$ (cm$^{-3}$)/100 to 5000 (nm)
Region S12:
$10^{13}$ to $10^{19}$ (cm$^{-3}$)/100 to 5000 (nm)
Region S11*:
$10^{12}$ to $10^{18}$ (cm$^{-3}$)/100 to 5000 (nm)
Region S12*:
$10^{13}$ to $10^{19}$ (cm$^{-3}$)/100 to 5000 (nm)
Region S12**:
$10^{13}$ to $10^{19}$ (cm$^{-3}$)/100 to 5000 (nm)
Taper region S12*:
$10^{12}$ to $10^{18}$ (cm$^{-3}$)/100 to 5000 (nm)
Channel region B2:
$10^{11}$ to $10^{17}$ (cm$^{-3}$)/100 to 5000 (nm)
Drain region ARD:
$10^{17}$ to $10^{20}$ (cm$^{-3}$)/100 to 5000 (nm)
Potential barrier region. BR:
$10^{11}$ to $10^{17}$ (cm$^{-3}$)/100 to 5000 (nm)

As described above, the linear image sensor described above can give a clock pulse changing in a few micro seconds to the reset gate electrode, realize a high speed shutter, and use a large-sized pixel region of each optical detection unit, thereby improving an S/N ratio.

REFERENCE SIGNS LIST

10 Semiconductor substrate
B Barrier region
S1 Photoelectric conversion region
S2 Charge accumulation region
R Resistive gate electrode (potential inclination forming means)
ARD Drain region
ARG Reset gate electrode

The invention claimed is:

1. A linear image sensor which comprises a plurality of optical detection units aligned in a row direction, each optical detection unit including a plurality of pixel regions aligned in a column direction, integrates signals from the plurality of pixel regions for each of the optical detection units, and outputs electrical signals corresponding to a one-dimensional optical image in time series,
   wherein each of the pixel regions includes
   a photoelectric conversion region having N-type conductivity for performing photoelectric conversion on an incident energy beam,
   a resistive gate electrode provided on the photoelectric conversion region for forming a potential inclination which promotes transfer of charges in the column direction in the photoelectric conversion region,
   a charge accumulation region having N-type conductivity for accumulating charges generated in each of the photoelectric conversion regions,
   a drain region which is adjacent to the charge accumulation region in the row direction through a channel region, and
   a reset gate electrode which is disposed on the channel region in the row direction to control an amount of charges flowing in the channel region,
   wherein the drain region and the reset gate electrode are aligned in the row direction.

2. The linear image sensor according to claim 1,
   wherein a potential barrier region having a lower impurity concentration than the photoelectric conversion region is formed between the charge accumulation region in a certain pixel region and the photoelectric conversion region in a pixel region adjacent to a rear stage of the pixel region.

3. The linear image sensor according to claim 1,
   wherein the photoelectric conversion region is a photoelectric converter; and
   wherein the charge accumulation region is a charge accumulator.

4. A linear image sensor which comprises a plurality of optical detection units aligned in a row direction, each optical detection unit including a plurality of pixel regions aligned in a column direction, integrates signals from the plurality of pixel regions for each of the optical detection units, and outputs electrical signals corresponding to a one-dimensional optical image in time series,
   wherein each of the pixel regions includes
   a photoelectric conversion region having N-type conductivity,
   a resistive gate electrode provided on the photoelectric conversion region;
   a charge accumulation region having N-type conductivity positioned between photoelectric conversion regions aligned in the column direction;
   a drain region which is adjacent to the charge accumulation region in the row direction through a channel region, and
   a reset gate electrode which is disposed on the channel region in the row direction to control an amount of charges flowing in the channel region,
   wherein the drain region and the reset gate electrode are aligned in the row direction.

* * * * *